(12) United States Patent
Horii et al.

(10) Patent No.: US 8,581,359 B2
(45) Date of Patent: Nov. 12, 2013

(54) SCHOTTKY BARRIER DIODE

(75) Inventors: Taku Horii, Osaka (JP); Tomihito Miyazaki, Osaka (JP); Makoto Kiyama, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 152 days.

(21) Appl. No.: 12/516,714

(22) PCT Filed: Aug. 22, 2008

(86) PCT No.: PCT/JP2008/064985
§ 371 (c)(1),
(2), (4) Date: May 28, 2009

(87) PCT Pub. No.: WO2009/028410
PCT Pub. Date: Mar. 5, 2009

(65) Prior Publication Data
US 2010/0059761 A1    Mar. 11, 2010

(30) Foreign Application Priority Data

Aug. 31, 2007 (JP) ............................... 2007-226158
Jul. 18, 2008 (JP) ............................... 2008-187476

(51) Int. Cl.
*H01L 29/47* (2006.01)
*H01L 29/02* (2006.01)

(52) U.S. Cl.
USPC .............. 257/471; 257/488; 257/E21.359; 257/E21.368; 257/E27.04

(58) Field of Classification Search
USPC ............ 257/471, 168, 483, 155, 496, E27.04, 257/E29.338, E21.047, E21.064, E21.359, 257/E21.368, 54, 73, 267, 280, 281, 284, 257/453, 454, 488; 438/534, 570
See application file for complete search history.

(56) References Cited

U.S. PATENT DOCUMENTS 4,412,242 A * 10/1983 Herman et al. ............... 257/634
5,763,904 A *  6/1998 Nakajima et al. ............ 257/66
(Continued)

FOREIGN PATENT DOCUMENTS

EP    1 041 643 A1    10/2000
EP    1 876 649 A1     1/2008
(Continued)

OTHER PUBLICATIONS

Tanabe et al., "Epitaxial Growth of GaN on GaN Substrate and Its Application to Power Device", SEI Technical Review, No. 170, pp. 34-39, Jan. 2007.

(Continued)

*Primary Examiner* — Daniel Luke
*Assistant Examiner* — Khaja Ahmad
(74) *Attorney, Agent, or Firm* — Venable LLP; Michael A. Sartori; Tamatane J. Aga (57) ABSTRACT

A Schottky barrier diode includes a GaN freestanding substrate having a front surface, a GaN epitaxial layer deposited on the front surface, and an insulation layer deposited on the GaN epitaxial layer at a front surface and having an opening. Furthermore, the Schottky barrier diode also includes an electrode. The electrode is configured by a Schottky electrode provided in the opening in contact with the GaN epitaxial layer, and a field plate electrode connected to the Schottky electrode and also overlapping the insulation layer. The GaN freestanding substrate has a dislocation density of at most $1 \times 10^8 \, \text{cm}^{-2}$.

6 Claims, 4 Drawing Sheets

(56) References Cited

U.S. PATENT DOCUMENTS

| | | | |
|---|---|---|---|
| 6,423,598 B1* | 7/2002 | Takahashi et al. | 438/281 |
| 2004/0046224 A1* | 3/2004 | Rossel et al. | 257/471 |
| 2004/0262629 A1* | 12/2004 | Redd et al. | 257/168 |
| 2005/0133818 A1 | 6/2005 | Johnson et al. | |
| 2005/0161760 A1* | 7/2005 | Templier et al. | 257/483 |
| 2006/0046331 A1* | 3/2006 | Kiyama et al. | 438/22 |
| 2007/0026620 A1* | 2/2007 | Yamada | 438/308 |
| 2008/0093709 A1* | 4/2008 | Matsuura et al. | 257/632 |
| 2010/0068855 A1* | 3/2010 | Saxler et al. | 438/172 |

FOREIGN PATENT DOCUMENTS

| | | |
|---|---|---|
| JP | 56-035474 | 4/1981 |
| JP | 2002-9302 | 1/2002 |
| JP | 2006-100801 | 4/2006 |
| JP | 2006-310408 | 11/2006 |
| JP | 2007-059711 | 3/2007 |
| JP | 2007-516615 A | 6/2007 |
| WO | WO 00/21140 A1 | 4/2000 |

OTHER PUBLICATIONS

Takada et al., "AlGaN/GaN HEMT power device", Toshiba Review, vol. 59, No. 7, pp. 35-38, Jul. 2004.

Extended European Search Report in European Patent Application No. 08828484.9-1555, dated Feb. 25, 2013.

Baik, K. H. et al., "160-A bulk GaN Schottky diode array," Applied Physics Letters, American Institute of Physics, vol. 83, No. 15, Oct. 13, 2003, pp. 3192-3194.

Remashan, K. et al., "Simulation and fabrication of high voltage AlGaN/GaN based Schottky diodes with field plate edge termination," Microelectronic Engineering, vol. 84, No. 12, (2007), pp. 2907-2915.

Baik, K. H. et al., "Design of junction termination structures for GaN Shottky power rectifiers," Solid-State Electronics, Elsevier Science Publishers, vol. 47, No. 6 (2003), pp. 975-979.

Notice of Grounds of Rejection in Japanese Patent Application No. 2008-187476 dated May 7, 2013.

* cited by examiner

SCHOTTKY BARRIER DIODE

TECHNICAL FIELD

The present invention relates generally to Schottky barrier diodes and particularly to Schottky barrier diodes having improved reverse withstand voltage.

BACKGROUND ART

Gallium nitride (GaN) has excellent characteristics in comparison with silicon (Si). For example, the former has a band gap approximately three times that of the latter, a high breakdown electric field intensity approximately 10 times that of the latter, and larger saturation electron velocity, and the like. GaN is expected to simultaneously establish both high withstand voltage and small loss, i.e., low on-resistance, that conventional Si power devices can hardly achieve. GaN is thus expected to be applied to power devices (power semiconductor devices).

Conventionally, there have been proposed Schottky barrier diodes (SBDs), pn junction diodes, metal-insulator-semiconductor (MIS) transistors and other semiconductor devices that employ a GaN substrate (see Japanese Patent Laying-Open No. 2006-100801 (Patent Document 1) for example). Conventionally, power devices have employed a material of GaN generally in the form of a GaN epitaxial layer deposited on a substrate of sapphire, silicon carbide (SiC) or the like, i.e., different in composition. In contrast, a GaN epitaxial layer deposited on a GaN substrate has a lower impurity concentration and a lower dislocation density than a GaN epitaxial layer deposited on a substrate different in composition. Accordingly it is disclosed that epitaxial growth of GaN on a GaN substrate can implement a high withstand voltage and low on-resistance power device (see Tatsuya TANABE et al, "Epitaxial Growth of GaN on GaN Substrate and Its Application to Power Device", SEI Technical Review, No. 170, (Non Patent Document 1) for example).

Furthermore, a field plate (FP) structure is disclosed as a structure for reducing or preventing an electric field that is concentrated at an end portion of an electrode of a power device to achieve high withstand voltage (see Yoshiharu TAKADA et al, "AlGaN/GaN HEMT power device", Toshiba Review, Vol. 59, No. 7 (Non Patent Document 2) for example).

Patent Document 1: Japanese Patent Laying-Open No. 2006-100801

Non Patent Document 1: Tatsuya TANABE et al, "Epitaxial Growth of GaN on GaN Substrate and Its Application to Power Device", SEI Technical Review, No. 170, January 2007, pp. 34-39

Non Patent Document 2: Yoshiharu TAKADA et al, "AlGaN/GaN HEMT power device", Toshiba Review, Vol. 59, No. 7, July 2004, pp. 35-38

DISCLOSURE OF THE INVENTION

Problems to be Solved by the Invention

The present inventors have furthered studying for a Schottky barrier diode (SBD) employing a GaN substrate to achieve high withstand voltage. As a result, the present inventors have clarified for the first time that applying a field plate (FP) structure to an SBD fabricated with a GaN epitaxial layer deposited on a substrate different in composition such as a Si substrate or a sapphire substrate for example does not achieve a small leak current. In other words, if an SBD is fabricated with a GaN epitaxial layer deposited on a substrate different in composition, as a GaN material for a power device has conventionally, generally been done so, an FP structure applied to that SBD does not alleviate an electric field that is concentrated at an end of a Schottky electrode, and a sufficiently effectively decreased reverse leak current and sufficiently effectively increased reverse withstand voltage thus cannot be achieved.

Therefore, the present invention mainly contemplates a Schottky barrier diode that allows a field plate structure to alleviate a concentrated electric field and thus effectively achieve increased reverse withstand voltage.

Means for Solving the Problems

The present inventors have studied why an FP structure applied to an SBD fabricated with a GaN epitaxial layer deposited on a substrate different in composition does not sufficiently effectively alleviate an electric field. As a result, the present inventors have inferred that as a substrate different in composition such as a Si substrate, a sapphire substrate, and GaN have different crystalline structures, a GaN epitaxial layer deposited has a high dislocation density exceeding $1\times10^8$ cm$^{-2}$, and accordingly, the present inventors have provided the present invention configured as follows:

The present invention in one aspect provides a Schottky barrier diode comprising: a gallium nitride substrate having a major surface; an epitaxial layer deposited on the major surface; an insulation layer deposited on a surface of the epitaxial layer and having an opening; a Schottky electrode deposited in the opening in contact with the epitaxial layer; and a field plate electrode connected to the Schottky electrode and also overlapping the insulation layer, wherein the gallium nitride substrate has a dislocation density of at most $1\times10^8$ cm$^{-2}$.

Employing a gallium nitride substrate having a low dislocation density of at most $1\times10^8$ cm$^{-2}$ reduces dislocation in the epitaxial layer. Accordingly in a Schottky barrier diode having a field plate structure, the field plate structure alleviates an electric field under the condition that a reverse leak current is reduced. As a result, the reverse leak current is further reduced and increased reverse withstand voltage can be achieved. It is preferable that the gallium nitride substrate has lower dislocation density. For example, it is more preferable that the gallium nitride substrate has a dislocation density of at most $1\times10^6$ cm$^{-2}$. Note that in the state of the art the gallium nitride substrate's dislocation density has a lower limit value of approximately $1\times10^3$ cm$^{-2}$.

The present invention in another aspect provides a Schottky barrier diode comprising: a gallium nitride layer having a front surface; an insulation layer deposited on the gallium nitride layer at the front surface and having an opening; a Schottky electrode deposited in the opening in contact with the gallium nitride layer; and a field plate electrode connected to the Schottky electrode and also overlapping the insulation layer, wherein the gallium nitride layer has a region in contact with the Schottky electrode, the region having a dislocation density of at most $1\times10^8$ cm$^{-2}$.

The gallium nitride layer is in contact with the Schottky electrode at a region having a low dislocation density of at most $1\times10^8$ cm$^{-2}$. Accordingly in a Schottky barrier diode having a field plate structure, the field plate structure alleviates an electric field under the condition that a reverse leak current is reduced. As a result, the reverse leak current is further reduced and increased reverse withstand voltage can be achieved. It is preferable that the region of the gallium nitride layer that is in contact with the Schottky electrode has lower dislocation density.

A field plate structure, as referred to herein, indicates a structure configured by an insulation layer and a field plate electrode deposited on the insulation layer. The field plate electrode is electrically connected to the Schottky electrode, and the Schottky electrode and the field plate electrode are equal in potential. The field plate structure alleviates an electric field concentrated at an end portion of the Schottky electrode in operation as a cause of destroying a device, and thus allows the Schottky barrier diode to achieve high withstand voltage and high output. The insulation layer can be formed of material such as $SiN_x$ for example.

In the above one aspect preferably the Schottky barrier diode further comprises an ohmic electrode deposited on a rear surface opposite to the major surface and has a vertical structure allowing a current to flow from one of the Schottky electrode and the ohmic electrode to the other of the Schottky electrode and the ohmic electrode.

In the above other aspect preferably the Schottky barrier diode further comprises an ohmic electrode deposited on the gallium nitride layer at a rear surface opposite to the front surface and has a vertical structure allowing a current to flow from one of the Schottky electrode and the ohmic electrode to the other of the Schottky electrode and the ohmic electrode.

In general, for a power device, a vertical structure can flow a larger current than a lateral structure, and the vertical structure is a more suitable structure for the power device. Sapphire is insulative, and a power device employing a sapphire substrate cannot be provided in a vertical structure. In accordance with the present invention, a gallium nitride substrate and a gallium nitride layer are electrically conductive, and a vertical structure having an ohmic electrode deposited at a rear surface can be implemented.

Furthermore in the above one aspect preferably the Schottky barrier diode has the insulation layer having an end face facing the opening and inclined relative to a front surface of the epitaxial layer at an angle of at least 0.1° and at most 60°, and has the field plate electrode overlapping the insulation layer in contact with the end face of the insulation layer.

In the above other aspect preferably the Schottky barrier diode has the insulation layer having an end face facing the opening and inclined relative to the front surface of the gallium nitride layer at an angle of at least 0.1° and at most 60°, and has the field plate electrode overlapping the insulation layer in contact with the end face of the insulation layer.

The insulation layer has an end face inclined relative to a surface of the epitaxial layer or that of the gallium nitride layer, and the field plate structure can more effectively alleviate an electric field. The Schottky barrier diode can achieve further improved reverse withstand voltage.

A smaller inclination angle allows the field plate structure to more effectively alleviate an electric field and hence improve withstand voltage. If the inclination has an angle of less than 0.1°, however, the angle is poor in reproducibility, which may result in a problem in fabrication. Furthermore, the field plate electrode that does not have a current flowing therethrough is large relative to the Schottky electrode. This requires a material excessively, which is disadvantageous in fabrication. In contract, the inclination having an angle exceeding 60° reduces the effect of alleviating the electric field. It is more preferable that the inclination angle is at least 1° and at most 30°. The insulation layer can have the end face inclined by wet etching, dry etching or the like.

Furthermore in the above one and other aspects preferably the Schottky barrier diode has the Schottky electrode formed of a material including at least one type of substance selected from the group consisting of gold (Au), platinum (Pt), nickel (Ni), palladium (Pd), cobalt (Co), copper (Cu), silver (Ag), tungsten (W) and titanium (Ti). The Schottky electrode that is formed of these materials such as gold can implement a low leak current Schottky electrode, and the field plate structure alleviates an electric field. As a result, a reverse leak current is reduced and reverse withstand voltage is increased.

Furthermore in the above one and other aspects preferably the Schottky barrier diode has the insulation layer having a thickness of at least 10 nm and at most 5 μm. If the insulation layer has a thickness of less than 10 nm, the insulation layer has low withstand voltage. Accordingly, the insulation layer is first destroyed and the field plate structure's effect cannot be obtained. If the insulation layer has a thickness exceeding 5 μm, the alleviation per se of an electric field by the field plate structure cannot be obtained. The insulation layer more preferably has a thickness of at least 0.2 μm and at most 2 μm for example for a design with a withstand voltage of 1 kV.

Furthermore in the above one and other aspects preferably the Schottky barrier diode has the field plate electrode overlapping the insulation layer along a length of at least 1 μm and at most 1 mm. If the length is less than 1 μm, it is difficult to control, and the field plate structure's effect cannot be obtained reliably. If the length exceeds 1 mm, the alleviation per se of an electric field by the field plate structure cannot be obtained. The length is more preferably at least 5 μm and at most 40 μm, as a depletion layer has a width extending to at least 2 μm and at most 20 μm for example for a design with a withstand voltage of 1 kV.

Effects of the Invention

The present Schottky barrier diode allows a field plate structure to alleviate a concentrated electric field and as a result can reduce a reverse leak current and thus achieve increased reverse withstand voltage effectively.

DESCRIPTION OF THE REFERENCE SIGNS 1, 11: Schottky barrier diode, 2: GaN freestanding substrate, 2a: front surface, 2b: rear surface, 3: GaN epitaxial layer, 3a: front surface, 3c: region, 4: insulation layer, 4a: end face, 5, 6, 25, 36: electrode, 12: GaN underlying layer, 13: support substrate, 32: sapphire substrate, 34: insulation layer.

Best Modes for Carrying Out the Invention

Hereinafter reference will be made to the drawings to describe the present invention in embodiments. In the following description, identical or corresponding components are denoted by identical reference characters and will not be described repeatedly.

First Embodiment

Figure 1:
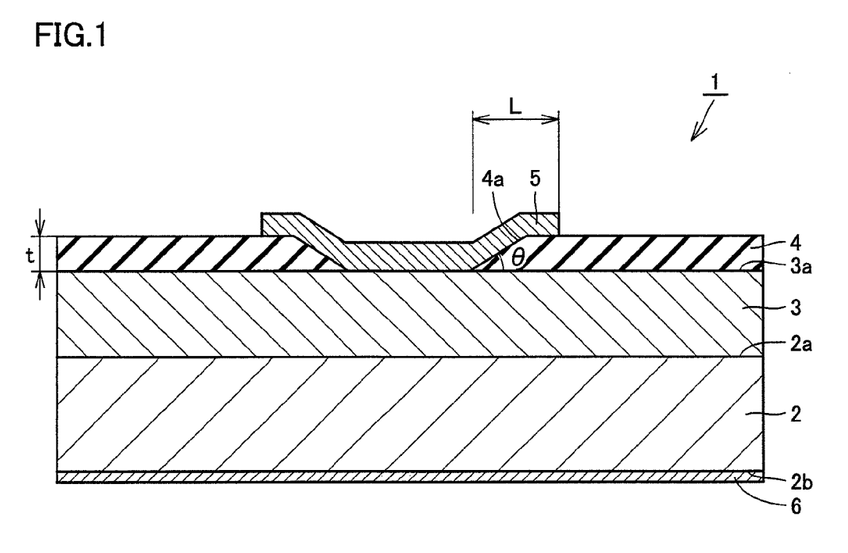
FIG. 1 is a cross section of a Schottky barrier diode in a first embodiment of the present invention.
Figure 2:
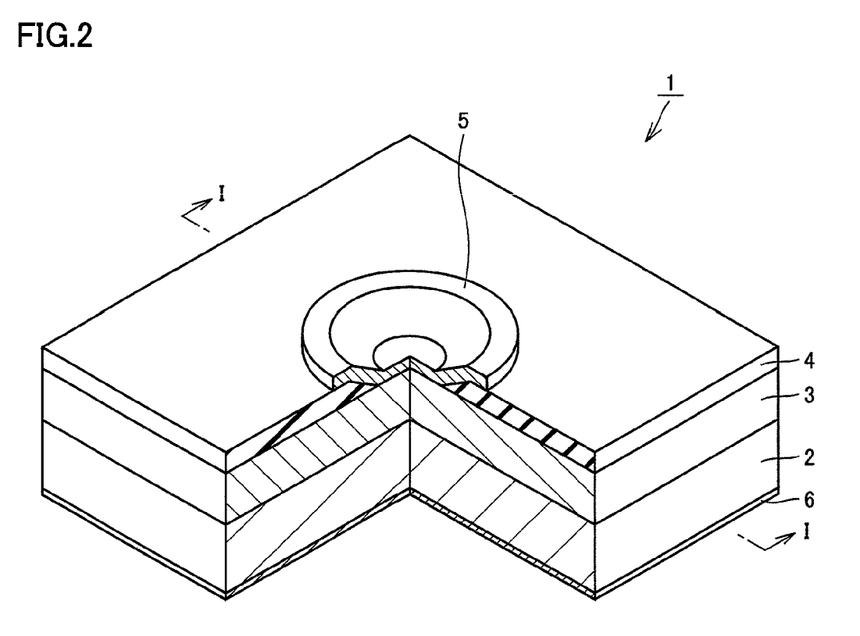
FIG. 2 is a perspective view of the FIG. 1 Schottky barrier diode.

FIG. 1 is a cross section of a Schottky barrier diode in a first embodiment of the present invention. FIG. 2 is a perspective view of the FIG. 1 Schottky barrier diode. As shown in FIG. 1 and FIG. 2, a Schottky barrier diode (SBD) 1 includes a GaN freestanding substrate 2 serving as a gallium nitride substrate, and a GaN epitaxial layer 3 serving as an epitaxial layer. GaN epitaxial layer 3 is deposited on GaN freestanding substrate 2 at a front surface 2a serving as a major surface. SBD 1 also includes an insulation layer 4. Insulation layer 4 is deposited on GaN epitaxial layer 3 at a front surface 3a.

SBD 1 further includes an electrode 5 in contact with front surface 3a of GaN epitaxial layer 3 and also overlapping insulation layer 4, and an electrode 6 adjacent to a rear surface 2b of GaN freestanding substrate 2. Insulation layer 4 has an opening and electrode 5 is provided in the opening of insulation layer 4. Electrode 5 is formed for example to be round in a plane.

Electrode 5 includes a Schottky electrode and a field plate (FP) electrode. The Schottky electrode is a portion internal to the opening of insulation layer 4 and in contact with front surface 3a of GaN epitaxial layer 3. The FP electrode is a portion overlapping insulation layer 4. The field plate electrode and insulation layer 4 form a field plate structure. Furthermore, the Schottky electrode cooperates with GaN epitaxial layer 3 to provide Schottky junction. Electrode 6 is an ohmic electrode cooperating with GaN freestanding substrate 2 to provide ohmic junction.

GaN freestanding substrate 2 has a dislocation density of at most $1 \times 10^8$ cm$^{-2}$. Furthermore, electrode 5 is formed of a material (i.e., the Schottky electrode is formed of a material) including at least one type of substance selected from the group consisting of gold, platinum, nickel, palladium, cobalt, copper, silver, tungsten and titanium. GaN freestanding substrate 2 having the low dislocation density of at most $1 \times 10^8$ cm$^{-2}$ allows GaN epitaxial layer 3 to also have a dislocation density equivalent to that of GaN freestanding substrate 2, i.e., at most $1 \times 10^8$ cm$^{-2}$. SBD 1 having the FP structure thus has the FP structure significantly alleviating an electric field under the condition that a reverse leak current is reduced and the condition that a Schottky electrode formed of an electrode such as gold, which can implement a small leak current, is employed. As a result, the reverse leak current can further be reduced and increased reverse withstand voltage can be achieved. Note that a dislocation density can be measured for example by counting the number of pits formed by etching in melted KOH, and dividing the counted number by a unit area.

Furthermore, SBD 1 has a vertical structure allowing a current flowing from one of the Schottky electrode and the ohmic electrode to the other thereof. In general, for a power device, a vertical structure can flow a larger current than a lateral structure, and the vertical structure is a more suitable structure for the power device. In SBD 1, GaN freestanding substrate 2 and GaN epitaxial layer 3 are electrically conductive, and a vertical structure having the ohmic electrode provided at the rear surface can be provided.

Insulation layer 4 can be formed of silicon nitride film (SiN$_x$). Furthermore, insulation layer 4 can contain hydrogen having a concentration of less than $3.8 \times 10^{22}$ cm$^{-3}$, more preferably less than $2.0 \times 10^{22}$ cm$^{-3}$. Thus, SiN$_x$ having a low concentration of hydrogen in the film can be applied as an insulation film forming the FP structure. The insulation layer with a low concentration of hydrogen is more effective than that with a high concentration of hydrogen in that the FP structure alleviates an electric field that is concentrated at an end of the Schottky electrode to achieve effectively increased reverse withstand voltage. In other words, SBD 1 can significantly effectively alleviate an electric field and achieve increased reverse withstand voltage.

FIG. 1 shows insulation layer 4 having a thickness represented by t. Desirably, insulation layer 4 has thickness t of at least 10 nm and at most 5 μm. If insulation layer 4 has thickness t of less than 10 nm, insulation layer 4 has low withstand voltage. Accordingly, insulation layer 4 is first destroyed and the FP structure's effect cannot be obtained. If insulation layer 4 has a thickness exceeding 5 μm, the alleviation per se of an electric field by the FP structure cannot be obtained.

Furthermore, FIG. 1 indicates a dimension L, which indicates the field plate's length. The field plate's length indicates that length of the field plate electrode which overlaps insulation layer 4. In the present embodiment the FP length is a length along which the FP electrode overlaps insulation layer 4 in a cross section of SBD 1, as shown in FIG. 1, that traverses the center of electrode 5 round in geometry in a plane. In other words, when insulation layer 4 has an opening round in geometry in a plane and electrode 5 has a portion, or the Schottky electrode, round in geometry in the plane, the FP length is a length along which the FP electrode overlaps insulation layer 4 in the Schottky electrode's radial direction.

In other words, the field plate's length refers to a length along which the field plate electrode overlaps the insulation layer in a direction of a straight line connecting a barycenter for the geometry of the Schottky electrode in the plane and one point present on the geometry's perimeter. Desirably, such an FP length is at least 1 μm and at most 1 mm. If the FP length is less than 1 μm, it is difficult to control, and the FP structure's effect cannot be obtained reliably. If the FP length exceeds 1 mm, the alleviation per se of an electric field by the FP structure cannot be obtained.

Furthermore, as shown in FIG. 1, insulation layer 4 has an end face 4a facing the opening serving as a portion having electrode 5 in contact with GaN epitaxial layer 3. End face 4a inclines to form an angle θ relative to front surface 3a of GaN epitaxial layer 3. The portion of electrode 5 that overlaps insulation layer 4, i.e., the FP electrode, is overlapped on insulation layer 4 in contact with end face 4a.

End face 4a inclined relative to front surface 3a allows the FP structure to more effectively alleviate an electric field and hence SBD 1 to have further improved reverse withstand voltage. Insulation layer 4 can have end face 4a inclined, as described above, by wet etching, dry etching or the like. End face 4a is formed to have angle θ of at least 0.1° and at most 60°. If the inclination has an angle of less than 0.1°, the angle is poor in reproducibility, and furthermore, an excessive material is required, which may result in a problem in fabrication. In contrast, the inclination having an angle exceeding 60° reduces the effect of alleviating an electric field.

Figure 3:
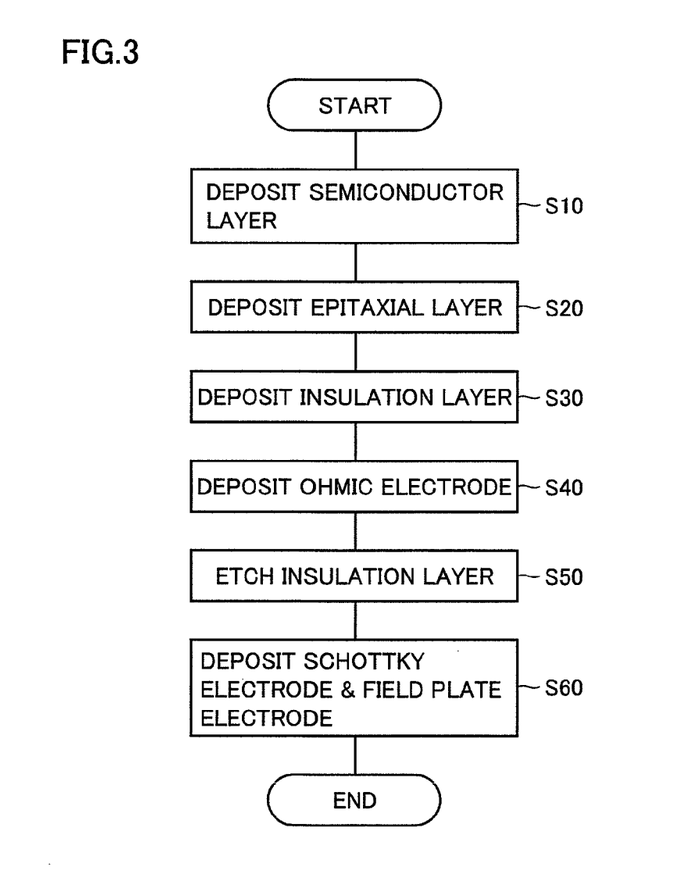
FIG. 3 shows in a flowchart each step of a method of fabricating the Schottky barrier diode of the first embodiment of the present invention.

Hereinafter, a method of fabricating SBD 1 will be described. FIG. 3 shows in a flowchart each step of a method of fabricating the Schottky barrier diode of the first embodiment of the present invention. With reference to FIG. 1 to FIG. 3, the method of fabricating a Schottky barrier diode of the present invention will be described.

Initially, with reference to FIG. 3, a step (S10) is performed to provide a semiconductor layer. More specifically, there is prepared an n conduction type, (0001) plane GaN freestanding substrate 2 deposited by hydride vapor phase epitaxy (HYPE). GaN freestanding substrate 2 has a carrier density for example of $3\times10^{18}$ cm$^{-3}$, a thickness for example of 400 μm, and an average dislocation density for example of $1\times10^6$ cm$^{-2}$. Subsequently in step (S20) an epitaxial layer is deposited. More specifically, on GaN freestanding substrate 2, an n conduction type epitaxial layer is grown by organo-metallic vapor phase epitaxy (OMVPE) to have a carrier density for example of $5\times10^{15}$ cm$^{-3}$ and a thickness for example of 7 μm to deposit a GaN epitaxial layer 3. GaN epitaxial layer 3 has an average dislocation density similar for example to that of GaN freestanding substrate 2, i.e., $1\times10^6$ cm$^{-2}$.

Subsequently in step (S30) an insulation layer is deposited. More specifically, on GaN epitaxial layer 3, an insulation layer 4 is deposited by depositing SiN$_x$ by plasma chemical vapor deposition (plasma CVD). Insulation layer 4 has thickness t of approximately 1 p.m. In doing so, a source gas of ammonia (NH$_3$) is used and SiN$_x$ is deposited from monosilane (SiH$_4$), NH$_3$, and hydrogen (H$_2$). Depositing SiN$_x$ from SiH$_4$ and N$_2$ without using NH$_3$ is preferable, as such can reduce the concentration of the hydrogen in insulation layer 4.

Subsequently in step (S40) an ohmic electrode is deposited. More specifically, GaN freestanding substrate 2 has rear surface 2b cleaned organically and cleaned with hydrochloric acid and thereafter Ti/Al/Ti/Au (20 nm/100 nm/20 nm/200 nm) is deposited by electron beam deposition (EB deposition) on the entirety of rear surface 2b. Subsequently in an ambient of nitrogen the intermediate product is heated for approximately 2 minutes to 600° C. and alloyed to provide electrode 6 serving as the ohmic electrode.

Subsequently in step (S50) the insulation layer etched. More specifically, photolithography is employed to provide a pattern on insulation layer 4. Subsequently, buffered hydrogen fluoride (BHF) is used to wet etch insulation layer 4. Subsequently, the intermediate product is cleaned organically and ashed in an ambient of oxygen and nitrogen to remove a resist. Insulation layer 4 is thus etched and thus provided with an opening. At this point of time, the opening exposes GaN epitaxial layer 3. The opening can be formed for example to have a side surface having the geometry of a circular conical surface of a truncated cone having a maximal value of 200 μm in diameter.

Subsequently in step (S60) a Schottky electrode and an FP electrode are deposited. More specifically, photolithography is employed to pattern the intermediate product. Subsequently, it is cleaned with hydrochloric acid to treat a surface of GaN epitaxial layer 3 at room temperature for 3 minutes, and thereafter, as a material for an electrode, Au (400 nm) is deposited by resistance heating deposition. Subsequently when a resist is removed the material of the electrode deposited on the resist is simultaneously removed (lifted off) and electrode 5 is thus deposited. Electrode 5 can be formed to have a geometry larger in diameter than the opening formed in insulation layer 4. For example, it can be formed in a circle having a diameter of 220 μm in a plane.

Thus, a Schottky electrode that is a portion provided in the opening of insulation layer 4 in contact with front surface 3a of GaN epitaxial layer 3, and an FP electrode that is a portion connected to the Schottky electrode and also overlapping insulation layer 4, are provided. In other words, electrode 5 is larger in diameter than the opening of insulation layer 4 and thus has a portion overlapping insulation layer 4 to provide the FP electrode.

By the above described fabrication method the FIG. 1 and FIG. 2 SBD 1 can be fabricated. SBD 1 fabricated in this method has a semiconductor layer provided in step (S10) employing GaN freestanding substrate 2 having a low dislocation density of at most $1\times10^8$ cm$^{-2}$ to allow GaN epitaxial layer 3 to have a low dislocation density. Furthermore, it has a Schottky electrode provided in step (S60) using gold as a material therefor (i.e., a material for electrode 5). As a result a reverse leak current is reduced and increased reverse withstand voltage can be achieved.

In the above described SBD fabrication method step (S60) is performed to deposit a Schottky electrode and an FP electrode simultaneously. Alternatively there may be provided a step of depositing the Schottky electrode and, subsequently, a step of depositing the FP electrode. More specifically, with reference to FIG. 1 and FIG. 2, the Schottky electrode may be deposited in the opening of insulation layer 4 in contact with GaN epitaxial layer 3 and the FP electrode may then be deposited to connect to the Schottky electrode and also overlap insulation layer 4. In that case, the FP electrode may be formed of the same material(s) as the Schottky electrode. Alternatively, the FP electrode may be formed of a material different from that of the Schottky electrode, such as a material satisfactorily adhesive to insulation layer 4.

Second Embodiment

Figure 4:
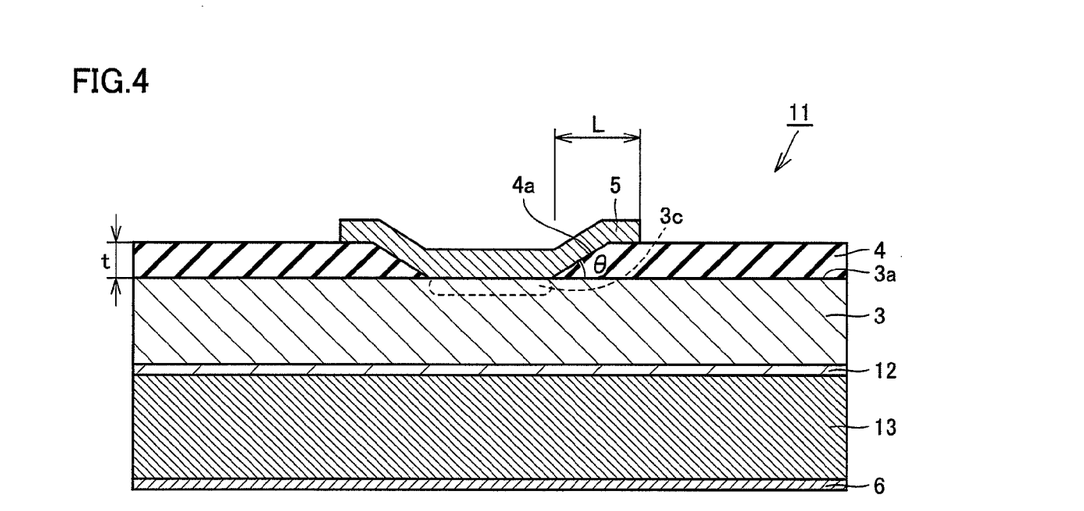
FIG. 4 is a cross section of a Schottky barrier diode in a second embodiment of the present invention.

FIG. 4 is a cross section of a Schottky barrier diode in a second embodiment of the present invention. As shown in FIG. 4, the present embodiment provides a Schottky barrier diode (SBD) 11 basically similar in configuration to Schottky barrier diode 1 of the first embodiment, except that the former excludes GaN freestanding substrate 2.

More specifically, Schottky barrier diode 11 includes a support substrate 13, a GaN underlying layer 12, GaN epitaxial layer 3, insulation layer 4, a Schottky electrode, and a field plate electrode. A region 3c in contact with the Schottky electrode in GaN epitaxial layer 3 has a dislocation density of at most $1\times10^8$ cm$^2$.

Support substrate 13 is an electrically conductive substrate. Support substrate 13 underlies GaN underlying layer 12. GaN underlying layer 12 underlies GaN epitaxial layer 3. Note that support substrate 13 and GaN underlying layer 12 together make ohmic contact. If support substrate 13 is formed of metal, electrode 6 may be dispensed with. The remainder in configuration is similar to the first embodiment. Accordingly, it will not be described repeatedly.

Figure 5:
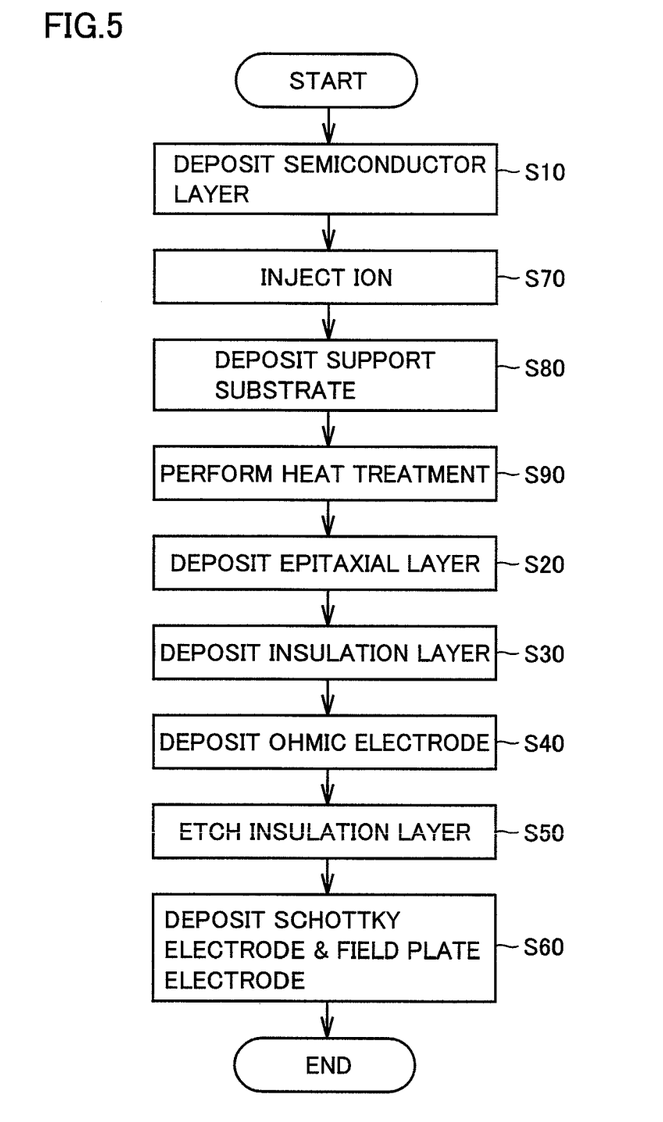
FIG. 5 shows in a flowchart each step of a method of fabricating the Schottky barrier diode of the second embodiment of the present invention.

SBD 11 is fabricated in a method, as will be described hereinafter. FIG. 5 shows in a flowchart each step of a method of fabricating the Schottky barrier diode of the second embodiment of the present invention. The method of fabricating SBD 11 in the present embodiment is basically similar in configuration to the method of fabricating SBD 1 as described in the first embodiment, except that the former further includes the step of removing a GaN freestanding substrate.

More specifically, similarly as done in the first embodiment, a semiconductor layer deposition step (S10) is performed to prepare GaN freestanding substrate 2. Then an ion injection step (S70) is performed to inject an impurity in the form of ions to GaN freestanding substrate 2 at front surface 2a or rear surface 2b. This provides GaN freestanding substrate 2 in a vicinity of front surface 2a or rear surface 2b with a layer containing the impurity in a large amount. Subsequently, a support substrate deposition step (S80) is performed to bond the surface having the ions injected thereto and support substrate 13 together. Subsequently, a heat treatment step (S90) is performed to subject GaN freestanding substrate 2 and support substrate 13 that are bonded together to a heat treatment. This splits GaN freestanding substrate 2 such that the region of GaN freestanding substrate 2 that contains the impurity in the large amount serves as a boundary. As a result, support substrate 13, and GaN underlying layer 12 overlying support substrate 13 and smaller in thickness than GaN freestanding substrate 2 can form a substrate. The SBD requires only a portion of expensive GaN freestanding substrate 2 and the remainder of the substrate can be reused. The SBD can thus be fabricated at reduced cost.

Subsequently, an epitaxial layer deposition step (S20) is performed to deposit GaN epitaxial layer 3 on GaN underlying layer 12. GaN epitaxial layer 3 is in contact with a Schottky electrode at a region having a dislocation density of at most $1 \times 10^8$ cm$^{-2}$.

Note that while in the present embodiment, GaN freestanding substrate 2 is used to provide GaN underlying layer 12, and furthermore, GaN underlying layer 12 is used to provide GaN epitaxial layer 3, the present invention is not limited thereto.

Example

Hereinafter an example of the present invention will be described. As the present invention's SBD, SBD 1 described above is fabricated and subjected to an experiment measuring its reverse withstand voltage. SBD 1 is fabricated specifically in a method and has a size and other characteristics, as has been described with reference to FIG. 1 to FIG. 3, and the FP length is set at 10 μm and insulation film 4 has end face 4a inclined relative to front surface 3a of GaN epitaxial layer 3 at angle θ set at 11°. The reverse withstand voltage is measured in a method employing a high withstand voltage prober to perform current-voltage measurement with SBD 1 immersed in a fluorine based inert liquid. SBD 1 exhibits a reverse withstand voltage of 865 V.

Figure 6:
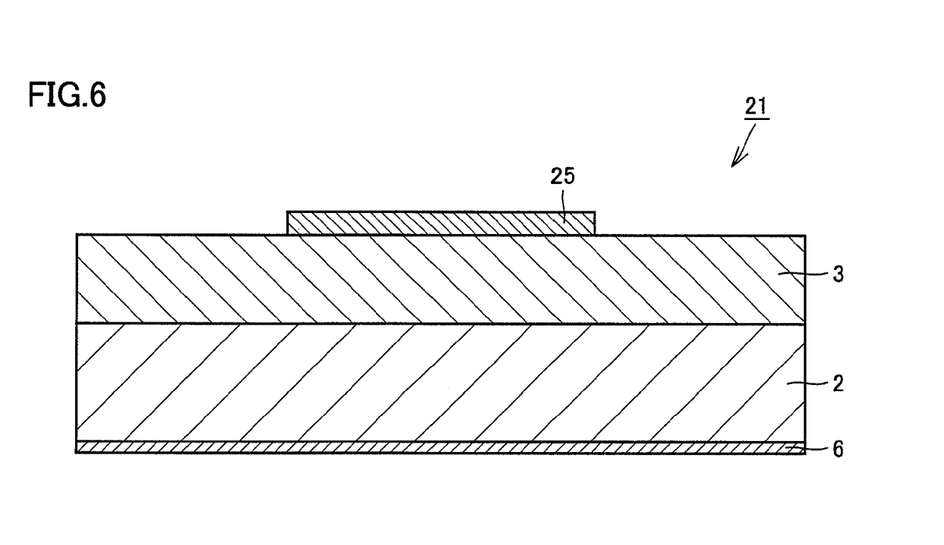
FIG. 6 is a cross section of an SBD that does not have an FP structure.

Furthermore, as a first comparative example, an SBD 21 which does not have an FP structure is fabricated. FIG. 6 is a cross section of the SBD that does not have the FP structure. As shown in FIG. 6, SBD 21 includes an electrode 25 serving as a Schottky electrode in the form of a column having a diameter of 200 μm. The method of fabricating SBD 21 differs from that of fabricating SBD 1, as shown in FIG. 3, in that the former does not provide an insulation layer and hence does not require steps (S30) and (S50). Except for the above, SBD 21 is fabricated in a process and has a size and other characteristics, similarly as described for SBD 1, and the FIG. 6 SBD has GaN freestanding substrate 2 having a dislocation density of $1 \times 10^6$ cm$^{-2}$, and GaN epitaxial layer 3 having a dislocation density equivalent to that of GaN freestanding substrate 2, i.e., $1 \times 10^6$ cm$^{-2}$. SBD 21 excluding the FP structure is measured for reverse withstand voltage. It exhibits a reverse withstand voltage of 350 V.

Figure 7:
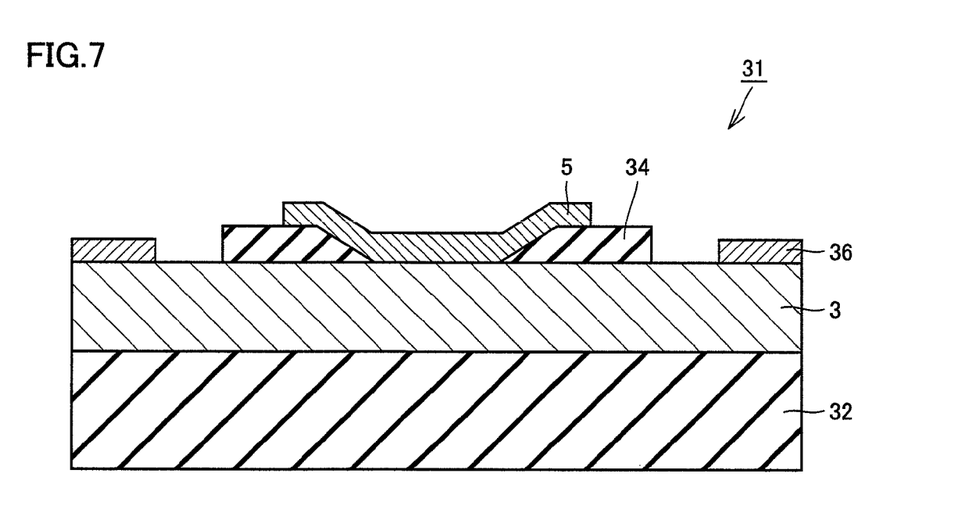
FIG. 7 is a cross section of an SBD that employs a sapphire substrate.

Furthermore, as a second comparative example, an SBD 31 employing a sapphire substrate is fabricated. FIG. 7 is a cross section of the SBD that employs the sapphire substrate. If a sapphire substrate is used, it is an insulator, and an SBD of a vertical structure cannot be fabricated. Accordingly, as shown in FIG. 7, SBD 31 having an FP structure by a lateral structure is fabricated. Note that an electrode 36 is an ohmic electrode.

The FIG. 7 SBD 31 is fabricated specifically in a method, as follows: Initially on a sapphire substrate 32 an n conduction type epitaxial layer is grown by OMVPE to have a carrier density of $5 \times 10^{15}$ cm$^3$ and a thickness of 7 μm to deposit GaN epitaxial layer 3. GaN epitaxial layer 3 shown in FIG. 7 has an average dislocation density of $1 \times 10^9$ cm$^{-2}$. Subsequently, on GaN epitaxial layer 3, SiN$_x$ is deposited by plasma CVD as an insulation layer 34 forming an FP structure. Insulation layer 34 has a thickness of approximately 1 μm.

Subsequently, an ohmic electrode is provided. More specifically, photolithography is employed to pattern the intermediate product, and thereafter it is cleaned organically and cleaned with hydrochloric acid, and thereafter Ti/Al/Ti/Au (20 nm/100 nm/20 nm/200 nm) is deposited by EB deposition. Subsequently when a resist is removed the electrode's material deposited on the resist is simultaneously removed (i.e., lifted off). Subsequently, the intermediate product is heated in an ambient of nitrogen for approximately 2 minutes to 600° C. and alloyed to provide electrode 36 serving as the ohmic electrode.

Subsequently, photolithography is employed to provide a pattern on insulation layer 34. Subsequently, BHF is used to wet etch insulation layer 34. Subsequently, the intermediate product is cleaned organically and ashed in an ambient of oxygen and nitrogen to remove a resist. Insulation layer 34 is thus etched and thus provided with an opening. The opening is formed to have a side surface having the geometry of a circular conical surface of a truncated cone having a maximal value of 200 μm in diameter.

Subsequently on GaN epitaxial layer 3 a Schottky electrode is deposited. More specifically, photolithography is employed to pattern the intermediate product. Subsequently, it is cleaned with hydrochloric acid to treat a surface of GaN epitaxial layer 3 at room temperature for 3 minutes, and thereafter, as a material for the electrode, Au (400 nm) is deposited by resistance heating deposition. Subsequently when a resist is removed the material of the electrode deposited on the resist is simultaneously removed (lifted off) and electrode 5 is thus deposited. Electrode 5 is formed to have a geometry larger in diameter than the opening of insulation layer 34 in the form of a circle having a diameter of 220 μm in a plane.

Thus, a Schottky electrode that is a portion provided in the opening of insulation layer 34 in contact with a front surface of GaN epitaxial layer 3, and an FP electrode that is a portion connected to the Schottky electrode and also overlapping insulation layer 34, are provided. In other words, electrode 5 is larger in diameter than the opening of insulation layer 34 and thus has a portion overlapping insulation layer 34 to provide the FP electrode. The FIG. 7 SBD 31 is thus fabricated. SBD 31 has an FP length set at 10 μm. SBD 31 employing a sapphire substrate exhibits a reverse withstand voltage of 130 V.

Furthermore, as a third comparative example, an SBD that employs a sapphire substrate and does not have an FP structure is fabricated. It is configured to include a Schottky electrode that does not have a geometry of electrode 5 and insulation layer 34 shown in FIG. 7 and instead has that of electrode 15 shown in FIG. 6. The SBD that employs the sapphire substrate and does not have the FP structure exhibits a reverse withstand voltage of 100 V.

Thus SBD 1 having the FP structure in accordance with the present invention has a reverse withstand voltage approximately 2.5 times that of SBD 21 that does not have an FP structure, as provided in the first comparative example. This indicates that SBD 1 of the present invention allows the FP structure to significantly effectively alleviate an electric field and can thus achieve increased reverse withstand voltage.

Furthermore, the present invention's SBD 1 that includes GaN freestanding substrate 2 having a low dislocation density accordingly also has GaN epitaxial layer 3 having a low dislocation density, and as a result, when it is compared with SBD 31 employing a sapphire substrate having a high dislocation density, as provided by the second comparative example, the former exhibits a reverse withstand voltage approximately 6.7 times that of the latter and hence significantly improved. Furthermore, when the present invention's SBD 1 is compared with the SBD that has a high dislocation density and does not have the FP structure, as provided in the third comparative example, the former exhibits a reverse withstand voltage approximately 8.7 times that of the latter and hence significantly improved. In contrast, when the second comparative example is compared with the third comparative example, the second comparative example i.e., SBD 31 having an FP structure, exhibits a reverse withstand voltage hardly increased in comparison with the third comparative example, i.e., an SBD that does not have an FP structure. In other words, it has been revealed that when GaN epitaxial layer 3 deposited on a sapphire substrate and having a high dislocation density is employed, an FP structure does not sufficiently effectively alleviate an electric field, and providing the FP structure does not provide increased reverse withstand voltage.

It should be understood that the embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

The invention claimed is:

1. Schottky barrier diode comprising:
    an electrically conductive support substrate having a front substrate surface;
    a gallium nitride underlying layer deposited on said front substrate surface of said electrically conductive support substrate;
    a gallium nitride layer deposited on said gallium nitride underlying layer, said gallium nitride layer having a front surface opposite to said gallium nitride underlying layer;
    an insulation layer deposited on said gallium nitride layer at said front surface and having an opening;
    a Schottky electrode deposited in said opening in contact with said gallium nitride layer; and
    a field plate electrode connected to said Schottky electrode and also overlapping said insulation layer,
    wherein said insulation layer has a round opening where said field plate electrode is formed and said field plate electrode overlaps said insulation layer in a cross section that traverses a center of said Schottky electrode that is round in geometry,
    wherein said electrically conductive support substrate and said gallium nitride underlying layer are connected to each other by bonding and together make ohmic contact,
    wherein said gallium nitride layer has a region in contact with said Schottky electrode, said region having a dislocation density of at most $1\times10^8$ cm$^{-2}$, and
    wherein said insulation layer is formed of silicon nitride film and contains hydrogen having a concentration of less than $3.8\times10^{22}$ cm$^{-3}$.

2. Schottky barrier diode according to claim 1, further comprising an ohmic electrode deposited on said electrically conductive support substrate at a rear substrate surface opposite to said front substrate surface,
    the Schottky barrier diode having a vertical structure allowing a current to flow from one of said Schottky electrode and said ohmic electrode to the other of said Schottky electrode and said ohmic electrode.

3. Schottky barrier diode according to claim 1, wherein:
    said insulation layer has an end face facing said opening and inclined relative to said front surface of said gallium nitride layer at an angle of at least 0.1° and at most 60'; and
    said field plate electrode overlaps said insulation layer in contact with said end face.

4. Schottky barrier diode according to claim 1, wherein said Schottky electrode is formed of a material including at least one type of substance selected from the group consisting of gold, platinum, nickel, palladium, cobalt, copper, silver, tungsten and titanium.

5. Schottky barrier diode according to claim 1, wherein said insulation layer has a thickness of at least 10 nm and at most 5 μm.

6. Schottky barrier diode according to claim 1, wherein said field plate electrode overlaps said insulation layer along a length of at least 1 μm and at most 1 mm.

* * * * *

UNITED STATES PATENT AND TRADEMARK OFFICE
CERTIFICATE OF CORRECTION

| | |
|---|---|
| PATENT NO. | : 8,581,359 B2 |
| APPLICATION NO. | : 12/516714 |
| DATED | : November 12, 2013 |
| INVENTOR(S) | : Horii et al. |

It is certified that error appears in the above-identified patent and that said Letters Patent is hereby corrected as shown below:

In the claims:

In claim 3, at column 12, in line 24, "60'" should be --60°--.

Signed and Sealed this
Tenth Day of June, 2014

Michelle K. Lee
*Deputy Director of the United States Patent and Trademark Office*